US011609283B2

(12) United States Patent
Romero

(10) Patent No.: US 11,609,283 B2
(45) Date of Patent: Mar. 21, 2023

(54) ELECTRICAL OFFSET COMPENSATING IN A MAGNETORESISTANCE BRIDGE

(71) Applicant: Allegro MicroSystems, LLC, Manchester, NH (US)

(72) Inventor: Hernán D. Romero, Buenos Aires (AR)

(73) Assignee: Allegro MicroSystems, LLC, Manchester, NH (US)

( * ) Notice: Subject to any disclaimer, the term of this patent is extended or adjusted under 35 U.S.C. 154(b) by 179 days.

(21) Appl. No.: 17/209,471

(22) Filed: Mar. 23, 2021

(65) Prior Publication Data

US 2022/0308130 A1 Sep. 29, 2022

(51) Int. Cl.
   *G01R 33/09* (2006.01)
(52) U.S. Cl.
   CPC .................................. *G01R 33/09* (2013.01)
(58) Field of Classification Search
   CPC ................ G01R 33/07; G01R 33/0035; G01R 33/0017; G01R 33/02; G01R 33/09
   See application file for complete search history.

(56) References Cited

U.S. PATENT DOCUMENTS

| 5,619,137 A | 4/1997 | Vig et al. |
| 6,967,526 B1 | 11/2005 | Churchill |
| 7,605,647 B1 | 10/2009 | Romero et al. |
| 8,736,369 B2 | 5/2014 | Petrie |
| 10,078,117 B2 | 9/2018 | Monreal et al. |
| 10,270,428 B1 | 4/2019 | Geisler et al. |
| 10,444,299 B2 | 10/2019 | Romero et al. |
| 10,481,219 B2 | 11/2019 | Romero et al. |
| 2006/0284671 A1 | 12/2006 | Ohba |
| 2007/0194847 A1 | 8/2007 | Machida |

(Continued)

FOREIGN PATENT DOCUMENTS

| JP | H-02185106 A | 7/1990 |
| JP | H-09246885 A | 9/1997 |
| JP | 2010-136039 A | 6/2010 |

OTHER PUBLICATIONS

U.S. Ex Parte Quayle Action dated Nov. 12, 2013 for U.S. Appl. No. 13/533,404; 6 Pages.

(Continued)

*Primary Examiner* — Alesa Allgood
(74) *Attorney, Agent, or Firm* — Daly, Crowley, Mofford & Durkee, LLP

(57) ABSTRACT

In one aspect, bridge circuitry includes a first magnetoresistance (MR) element; a second MR element connected in series with the first MR element at a first node; a third MR element; a fourth MR element connected in series with the third MR element at a second node; a first switch connected at one end to a supply voltage and connected at the other end to the third MR element; a second switch connected at one end to ground and connected at the other end to the fourth MR element; a third switch connected at one end to ground and connected at the other end to the third MR element and the first switch; and a fourth switch connected at one end to the supply voltage and the other end to the fourth MR element and the second switch. The first and second MR elements are in parallel with the third and fourth MR elements.

36 Claims, 7 Drawing Sheets

(56) References Cited

U.S. PATENT DOCUMENTS

| | | | |
|---|---|---|---|
| 2011/0115416 A1* | 5/2011 | Oh | H02J 7/345 |
| | | | 320/166 |
| 2017/0089987 A1 | 3/2017 | Monreal et al. | |
| 2018/0003522 A1* | 1/2018 | Ionescu | G01D 5/16 |
| 2021/0223023 A1 | 7/2021 | Romero | |
| 2021/0285794 A1 | 9/2021 | Briano et al. | |

OTHER PUBLICATIONS

Response to U.S. Ex Parte Quayle Action dated Nov. 12, 2013 for U.S. Appl. No. 13/533,404; Response filed Dec. 6, 2013; 19 Pages.

U.S. Notice of Allowance dated Feb. 3, 2014 for U.S. Appl. No. 13/533,404; 6 Pages.

PCT International Search Report and Written Opinion dated Dec. 16, 2013 for International Application No. PCT/US2013/044260; 13 Pages.

PCT International Preliminary Report dated Jan. 8, 2015 for International Application No. PCT/US2013/044260; 6 Pages.

Korean Office Action (with Machine English Translation) dated Apr. 26, 2019 for Korean Application No. 10-2014-7035295; 13 Pages.

Response (with Machine English Translation) to Korean Office Action dated Apr. 26, 2019 for Korean Application No. 10-2014-7035295; Response filed Jun. 18, 2019; 28 Pages.

Korean Notice of Allowance (with Machine English Translation) dated Sep. 2, 2019 for Korean Application No. 10-2014-7035295; 9 Pages.

Japanese Office Action (with Machine English Translation) dated May 17, 2017 for Japanese Application No. 2015-520218; 9 Pages.

Response (with Machine English Translation) to Japanese Office Action dated May 17, 2017 for Japanese Application No. 2015-520218; Response filed Jul. 11, 2017; 14 Pages.

Japanese Decision to Grant (with Machine English Translation) dated Jul. 20, 2017 for Japanese Application No. 2015-520218; 5 Pages.

European Communication Pursuant to Rules 161 and 162 dated Feb. 19, 2015 for European Application No. 13731194.0; 2 Pages.

Response to European Communication Pursuant to Rules 161 and 162 dated Feb. 19, 2015 for European Application No. 13731194.0; Response filed Aug. 28, 2015; 17 Pages.

European Intention to Grant dated Aug. 21, 2018 for European Application No. 13731194.0; 6 Pages.

PCT International Search Report and Written Opinion dated May 2, 2022 for International Application No. PCT/US2022/016399; 13 Pages.

* cited by examiner

ELECTRICAL OFFSET COMPENSATING IN A MAGNETORESISTANCE BRIDGE

BACKGROUND

Magnetic field sensors are used in a variety of applications, including, but not limited to, an angle sensor that senses an angle of a direction of a magnetic field; a current sensor that senses a magnetic field generated by a current carried by a current-carrying conductor; a magnetic switch that senses the proximity of a ferromagnetic object; a rotation detector that senses passing ferromagnetic articles, for example, magnetic domains of a ring magnet or a ferromagnetic target (e.g., gear teeth) where the magnetic field sensor is used in combination with a back-biased or other magnet; a magnetic field sensor that senses a magnetic field density of a magnetic field, a linear sensor that senses a position of a ferromagnetic target; and so forth.

In certain applications, magnetic field sensors include MR elements. As is also known, there are different types of MR elements, for example, a semiconductor MR element such as Indium Antimonide (InSb), a giant magnetoresistance (GMR) element, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

MR elements have an electrical resistance that changes in the presence of an external magnetic field. Spin valves are also a type of magnetoresistance element formed from two or more magnetic materials or layers. The simplest form of a spin valve has a reference (or magnetically fixed) layer and a free layer. The resistance of the spin valve changes as a function of the magnetic alignment of the reference and free layers. Typically, the magnetic alignment of the reference layer does not change, while the magnetic alignment of the free layer moves in response to external magnetic fields.

SUMMARY

In one aspect, bridge circuitry includes a first magnetoresistance (MR) element; a second MR element connected in series with the first MR element at a first node; a third MR element; a fourth MR element connected in series with the third MR element at a second node; a first switch connected at one end to a supply voltage and connected at the other end to the third MR element; a second switch connected at one end to ground and connected at the other end to the fourth MR element; a third switch connected at one end to ground and connected at the other end to the third MR element and the first switch; and a fourth switch connected at one end to the supply voltage and the other end to the fourth MR element and the second switch. The first and second MR elements are in parallel with the third and fourth MR elements.

The aspect above may include one or more of the following features. In a first mode, the first and second switches may be closed and the third and fourth switches may be open; in a second mode, the first and second switches may be open and the third and fourth switches may be closed; and taking a summation of a differential voltage output of the bridge in the first mode with a differential voltage output of the bridge in the second mode removes an electrical offset component from the differential output voltage of the bridge. The first and second switches may be controlled by a first clock signal and the third and fourth switches may be controlled by a second clock signal. When the first clock signal is at a high voltage level, the second clock signal may be at a low voltage level. When the first clock signal is at a low voltage level, the second clock signal may be at a high voltage level. The first MR element and the fourth MR element may be fabricated to have magnetic-field characteristics, which are substantially equal and the second MR element and the third MR element may be fabricated to have magnetic-field characteristics, which are substantially equal. The first MR element and the fourth MR element may have magnetic-field reference directions which are substantially equal. The second MR element and the third MR element may have magnetic-field reference angles which are substantially equal. The magnetic-field reference angles of the second and third MR elements may be opposite to the magnetic-field reference angles of the first and fourth MR elements. The magnetic-field reference angles of the second and third MR elements may be opposite to a direction of an external magnetic field. The magnetic-field reference angles of the second and third MR elements may be substantially the same as the magnetic-field reference angles of the first and fourth MR elements. The first and fourth MR elements may detect an external magnetic field that is an opposite direction from an external magnetic field detected by the second and third MR elements. The bridge circuitry may be a magnetometer or a gradiometer. The bridge circuitry may further include a fifth switch connected at one end to the supply voltage and connected at the other end to the first MR element and a sixth switch connected at one end to ground and connected at the other end to the second MR element. The fifth switch and the sixth switch may each be closed.

In another aspect, a magnetic-field sensor includes bridge circuitry. The bridge circuitry includes a first magnetoresistance (MR) element; a second MR element connected in series with the first MR element at a first node; a third MR element; a fourth MR element connected in series with the third MR element at a second node; a first switch connected at one end to a supply voltage and connected at the other end to the third MR element; a second switch connected at one end to ground and connected at the other end to the fourth MR element; a third switch connected at one end to ground and connected at the other end to the third MR element and the first switch; and a fourth switch connected at one end to the supply voltage and the other end to the fourth MR element and the second switch. The first and second MR elements are in parallel with the third and fourth MR elements.

The aspect above may include one or more of the following features. In a first mode, the first and second switches may be closed and the third and fourth switches may be open; in a second mode, the first and second switches may be open and the third and fourth switches may be closed; and taking a summation of a differential voltage output of the bridge in the first mode with a differential voltage output of the bridge in the second mode removes an electrical offset component from the differential output voltage of the bridge. The first and second switches may be controlled by a first clock signal and the third and fourth switches may be controlled by a second clock signal. When the first clock signal is at a high voltage level, the second clock signal may be at a low voltage level. When the first clock signal is at a low voltage level, the second clock signal may be at a high voltage level. The first MR element and the fourth MR element may be fabricated to have magnetic-field characteristics, which are substantially equal and the second MR element and the third MR element may be fabricated to have magnetic-field characteristics, which are substantially equal. The first MR element and the fourth MR element may have magnetic-field reference angles which are substantially equal. The second MR element and the third MR element may have magnetic-field reference angles which are substantially equal. The magnetic-field reference angles of the second and third MR elements may be opposite to the magnetic-field reference angles of the first and fourth MR elements. The magnetic-field reference angles of the second and third MR elements may be opposite to a direction of an external magnetic field. The magnetic-field reference angles of the second and third MR elements may be substantially the same as the magnetic-field reference angles of the first and fourth MR elements. The first and fourth MR elements may detect an external magnetic field that is an opposite direction from an external magnetic field detected by the second and third MR elements. The bridge circuitry may be a magnetometer or a gradiometer. The bridge circuitry may further include a fifth switch connected at one end to the supply voltage and connected at the other end to the first MR element and a sixth switch connected at one end to ground and connected at the other end to the second MR element. The fifth switch and the sixth switch may each be closed. The sensor may further include offset processing circuitry configured to receive the output of the bridge circuitry. The first and second switches may be controlled by a first clock signal, the third and fourth switches may be controlled by a second clock signal, and the offset processing circuitry may include an amplifier configured to receive the output of the bridge circuitry; a sample and hold (S&H) configured to receive an output of the amplifier; a filter configured to receive an output from the S&H circuit; and an adder configured to receive the output of the amplifier and an output of the filter. The S&H circuit may be enabled by a third clock signal. The filter is a first filter, and the offset processing circuitry may further include a second filter configured to receive an output of the adder. The S&H circuit is a first S&H circuit, and the offset processing circuitry may further include a second S&H configured to receive an output of the adder, wherein the second S&H circuit is enabled by a fourth clock signal. The fourth clock signal may be equal to the first clock signal. The fourth clock cycle may have a smaller duty cycle than the first clock signal. The third clock signal may be equal to the second clock signal. The third clock cycle may have a smaller duty cycle than the second clock signal.

In a further aspect, a method includes compensating for an electrical offset in a magnetoresistance (MR) bridge having a first leg and a second leg. A first end of the first leg is connected to a supply voltage and a second end of the first leg is connected to ground. A first end of the second leg is connected to a supply voltage and a second end of the second leg is connected to ground. The compensating includes measuring a first differential output voltage of the MR bridge; inverting, after measuring the first differential output voltage, the second leg of the MR bridge so that the second end is connected to the supply voltage and the first leg is connected to ground; measuring, after the inverting, a second differential output voltage; and combining the first and second differential output voltages. The inverting may close switches connected to MR elements of the MR bridge; and open switches connected to MR elements of the MR bridge.

DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more illustrative embodiments. Accordingly, the figures are not intended to limit the scope of the broad concepts, systems and techniques described herein. Like numbers in the figures denote like elements.

DETAIL DESCRIPTION

Described herein are techniques to compensate for an electrical offset in bridges that include magnetoresistance (MR) elements or MR bridges. Unlike Hall plates or vertical Hall devices, which can be modeled as Wheatstone bridges, bridges with MR elements cannot be current spun to remove their electrical offset, since they are built out of individual elements arranged as a Wheatstone bridge. Mismatches between MR elements in the MR bridge will manifest as an electrical offset component even in the absence of any applied magnetic field. The techniques described herein compensate for the electrical offset while a magnetic is applied to the MR bridge, which allows electrical offset and offset drift components to be removed, which significantly improves the accuracy of the MR bridge compared to not having any sort of compensation.

As used herein, the term "magnetic-field sensor" is used to describe a circuit that uses a magnetic field sensing element, generally in combination with other circuits. Magnetic-field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic-field sensor is used in combination with a back-biased or other magnet, and a magnetic-field sensor that senses a magnetic-field density of a magnetic field.

As used herein, the term "target" is used to describe an object to be sensed or detected by a magnetic-field sensor or a magnetoresistance element. The target may include a conductive material that allows for eddy currents to flow within the target, for example a metallic target that conducts electricity.

Figure 1:
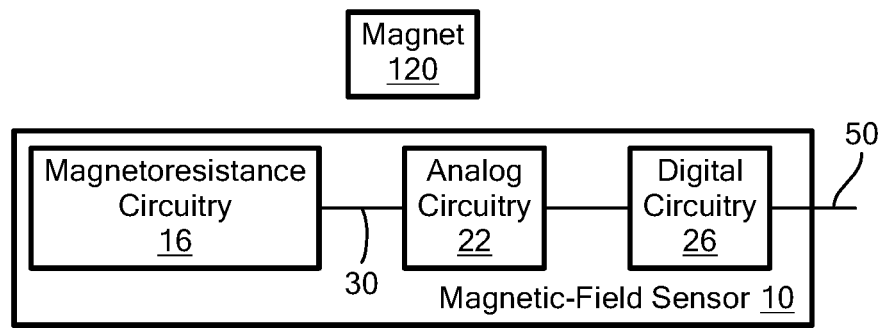
FIG. 1 is a diagram of an example of a magnetic-field sensor.

Referring to FIG. 1, a magnetic-field sensor 10 may include magnetoresistance circuitry 16, analog circuitry 22 and digital circuitry 26. The magnetoresistance detects changes in a magnetic field from a magnet 120.

The analog circuitry 22 is configured to receive an output signal 30 from the magnetoresistance circuitry 16. The analog circuitry 22 also converts the baseband signal from an analog signal to a digital signal.

The digital circuitry 26 receives the digital signal from the analog circuitry 22 and, for example, filters the digital signal. The filtered digital b signal is provided by the digital circuitry 26 as an output signal 50 of the magnetic field sensor 10. In some examples, the output signal may indicate the angle and/or position of the magnet 120.

Figure 2:
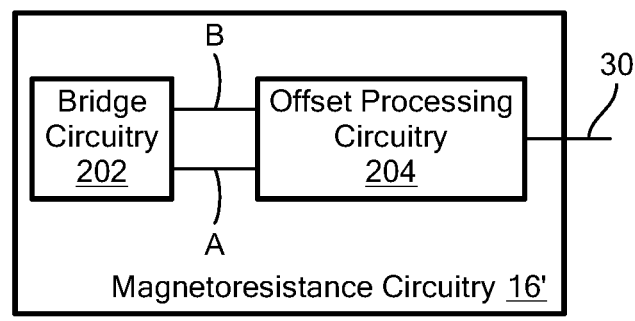
FIG. 2 is diagram of an example of magnetoresistance circuitry.

Referring to FIG. 2, an example of magnetoresistance circuitry 16 (FIG. 1) that compensates for an electrical offset in a MR bridge is magnetoresistance circuitry 16'. The magnetoresistance circuitry 16' includes bridge circuitry 202 and offset processing circuitry 204. The bridge circuit 202 has an output A and an output B, which is received by the offset processing circuitry 204. The offset processing circuitry 204 processes the outputs A and B to generate the output signal 30 that removes the effects of the electrical offset.

Figure 3A:
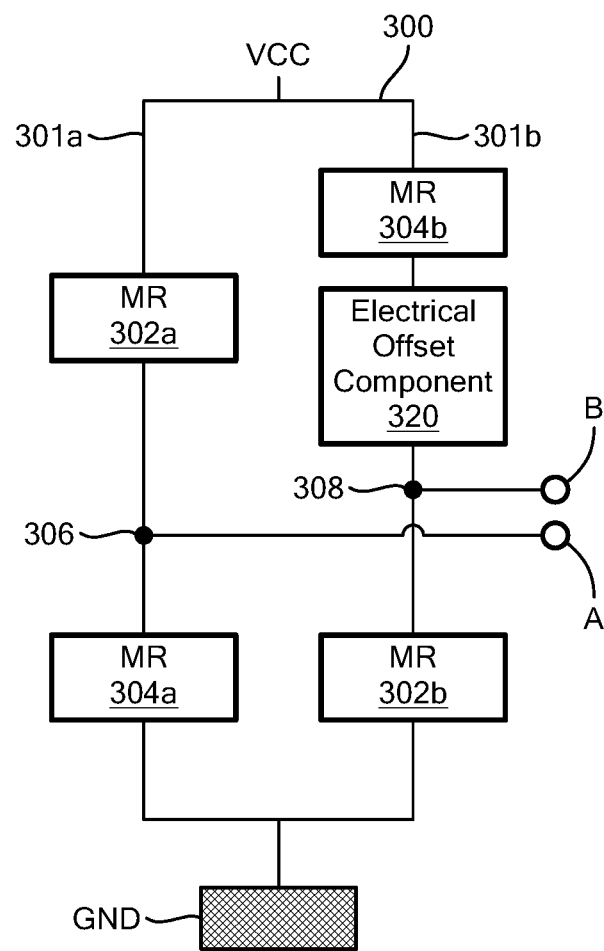
FIG. 3A is a diagram of a prior art bridge having magnetoresistance elements and an electrical offset.

Referring to FIG. 3A, a prior art bridge that includes MR elements is a MR bridge 300. The MR bridge 300 has a left leg 301a and a right leg 301b.

The MR bridge 300 includes an MR element 302a in series with an MR element 304a. The MR element 302a and the MR element 304a form the left leg 301a of the MR bridge 300.

The MR element 302a is connected to a supply voltage VCC and the MR element 304a is connected to the ground (GND). Between the MR element 302a and the MR element 304a is a first node 306 that forms an output A.

The MR bridge 300 also includes an MR element 302b in series with an MR element 304b. The MR element 304b is connected to the supply voltage VCC and the MR element 302b is connected to the ground (GND). Between the MR element 302b and the MR element 304b is a second node 308 that forms an output B. The voltage output of the MR bridge 300 is the difference between the output A and the output B.

The MR element 302a and the MR element 302b are fabricated to have the same magnetic-field characteristics (e.g., reference angle, electrical resistance and so forth). In one example, the MR element 302a and the MR element 302b have substantially the same reference angle within a few degrees, where the reference angle is the angle that the MR element is most sensitive to changes in an external magnetic field. In another example, the MR element 302a and the MR element 302b have substantially the same electrical resistance within a hundred ohms as a function of the magnetic field. For example, the MR element 302a and the MR element 302b have an electrical resistance R1(B), where B is the magnetic field.

The MR element 304a and the MR element 304b are fabricated to have the same magnetic-field characteristics (e.g., reference angle, electrical resistance and so forth). In one example, the MR element 304a and the MR element 304b have substantially the same reference angle within a few degrees. In another example, the MR element 304a and the MR element 304b have substantially the same electrical resistance within a hundred ohms as a function of the magnetic field. For example, the MR element 304a and the MR element 304b have an electrical resistance R2(B).

In one particular example, the bridge 300 is a magnetometer. The MR elements 302a, 302b. 304a, 304b detect the same external magnetic field (not shown). The reference angles for the MR elements 302a, 302b are in the same direction as the direction of the external magnetic field and opposite to the reference angles of the MR elements 304a, 304b.

In another particular example, the bridge 300 is a gradiometer. The reference angles for the MR elements 302a, 302b, 304a, 304b are in the same direction. In this configuration, the MR elements 302a, 302b detect an external magnetic field that is an opposite direction from an external magnetic field detected by the MR elements 304a, 304b.

However, mismatches due to fabrication, for example, are formed between the MR elements 302a, 302b, 304a, 304b producing an electrical offset. In FIG. 3A, an electrical offset is represented by an electrical offset component 320 disposed between the MR element 304b and the second node 308. The MR element 302b, MR element 304b and the electrical offset component 320 form the left leg 301b of the MR bridge 300.

With the resistance of the electrical offset component 320 represented as $\Delta R$, the voltage output of the MR bridge 300 is a function of the magnetic field and is expressed as:

$$Vout(B) = \frac{R2(B)}{R1(B) + R2(B) + \Delta R} \cdot VCC - \frac{R1(B)}{R1(B) + R2(B)} \cdot VCC$$

$$Vout(B) = \frac{R2(B) \cdot (R1(B) + R2(B)) - R1(B) \cdot (R1(B) + R2(B) + \Delta R)}{(R1(B) + R2(B) + \Delta R) \cdot (R1(B) + R2(B))} \cdot VCC$$

If $\Delta R << R1+R2$, then:

$$Vout(B) = \frac{\left(R2(B) - R1(B) \cdot \left(1 + \frac{\Delta R}{R1(B) + R2(B)}\right)\right) \cdot (R1(B) + R2(B))}{(R1(B) + R2(B))^2} \cdot VCC$$

$$Vout(B) = \frac{R2(B) - R1(B) - \frac{R1(B) \cdot \Delta R}{R1(B) + R2(B)}}{R1(B) + R2(B)} \cdot VCC$$

Since $\frac{R1(B)}{R1(B) + R2(B)} \cong \frac{1}{2}$ for small $B$ variations, then:

$$Vout(B) \cong \frac{R2(B) - R1(B) - \frac{\Delta R}{2}}{R1(B) + R2(B)} \cdot VCC.$$

The output of the MR bridge 300 is proportional to the resistance difference between the legs 301a, 301b of the MR bridge 300 caused by changes in the magnetic field. If there is a fixed unbalance between both legs (represented herein by ΔR, which does not depend on the magnetic field) that will add to the output voltage as an error component. If the sensed magnetic signals are baseband signals, then the electrical offset generated by ΔR cannot be distinguished from the magnetic signal (as it is the case if a current spinning method was used with Hall plates). Even when there is no magnetic field applied, an output voltage different from zero will exist:

$$Vout(B) = \frac{R2(0) - R1(0) - \frac{\Delta R}{2}}{R1(0) + R2(0)} \cdot VCC = -\frac{\Delta R/2}{R_{LEG}} \cdot VCC,$$

since the mismatch term is represented by ΔR, it is assumed that R2(B=0)=R1(B=0), while R1+R2 =RLEG for any applied magnetic field.

In one example, the MR elements 302a, 302b, 304a, 304b may each be a TMR element. In another example, the MR elements 302a, 302b, 304a, 304b may each be a GMR element. In a further example, one or more of the MR elements 302a, 302b, 304a, 304b may be either a TMR element or a GMR element.

Figure 3B:
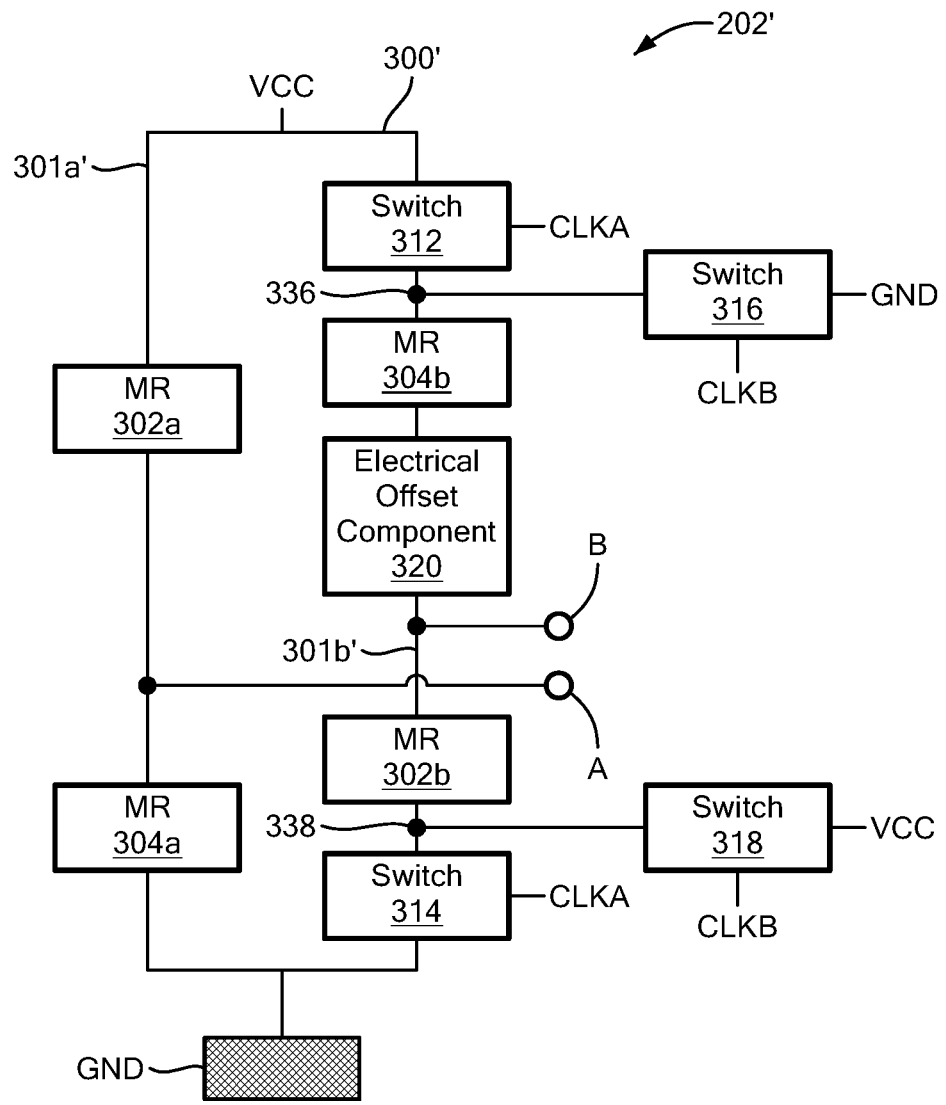
FIG. 3B is diagram of an example of bridge circuitry used to remove the effects of the electrical offset found in the prior art bridge circuitry of FIG. 3A.

Referring to FIG. 3B, an example of the bridge circuitry 202 (FIG. 2) is bridge circuitry 202' that removes the electrical offset component 320.

The bridge circuitry 202' includes a MR bridge 300'. The MR bridge 300' includes a left leg 301a' and a right leg 301b'. As will be further described herein, the output voltage of the MR bridge 300' is measured in a first mode; and the right leg 301b' can be inverted and the output voltage of the MR bridge 300' may be measured again in a second mode. The two output voltages of the MR bridge 300' for each mode may be used to remove the effects of the electrical offset 320.

The MR bridge 300' is like the MR bridge 300 but includes additional electrical components. The MR element 302b and the MR element 304b form the left leg 301a' of the MR bridge 300'. The MR element 302b, MR element 304b and the electrical offset component 320 form the right leg 301b' of the MR bridge 300'.

For example, the bridge circuitry 202' includes a switch 312 that is disposed between the supply voltage VCC and the MR element 304b; a switch 314 that is disposed between the MR element 202b and ground.

The bridge circuitry 202' also includes a switch 316 and a switch 318. The switch 316 is connected at one end to a third node 336 located between the switch 312 and the MR element 304b, and the switch 316 is connected at the other end to ground. The switch 318 is connected at one end to a fourth node 338 located between the switch 314 and the MR element 302b, and the switch 318 is connected at the other end to the supply voltage VCC.

Figure 4:
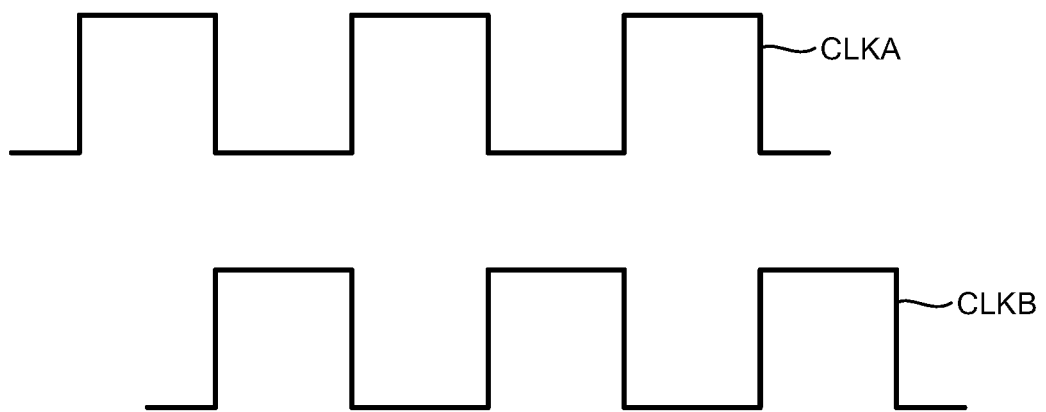
FIG. 4 is a graph of an example of a timing diagram of a first clock signal CLKA and a second clock signal CLKB.

The switches 312, 314 receive a clock signal CLKA. The switches 316, 318 receive a clock signal CLKB. One example of the clock signals CLKA and CLKB is depicted in FIG. 4.

When clock signal CLKA is at a high voltage level, the clock signal CLKB is at a low voltage level. This scenario is called a first mode.

When clock signal CLKA is at a low voltage level, the clock signal CLKB is at a high voltage level. This scenario is called a second mode.

In some examples, one or more of the switches 312, 314, 316, 318 may be a transistor. The transistor may be, for example, an n-type metal-oxide-semiconductor (NMOS) transistor.

In other examples, the bridge circuitry 202' may include additional switches on the left leg 301a' of the bridge 300' to compensate for the effect (e.g., resistance, parasitic capacitance and so forth) caused by the switches 312, 314. These additional switches on the left leg 301a' would be closed (i.e., in the "on" position) whether in the first mode or the second mode.

Figure 5B:
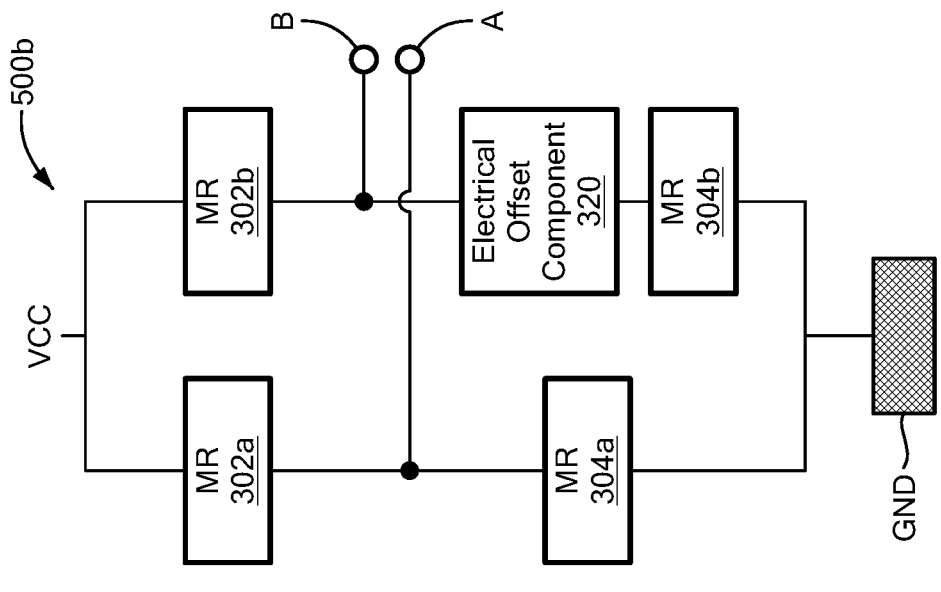
FIG. 5B is an example of an equivalent bridge circuit of the bridge circuitry in FIG. 3B when the first clock signal CLKA is at the low voltage level and the second clock signal CLKB is at the high low voltage level.
Figure 5A:
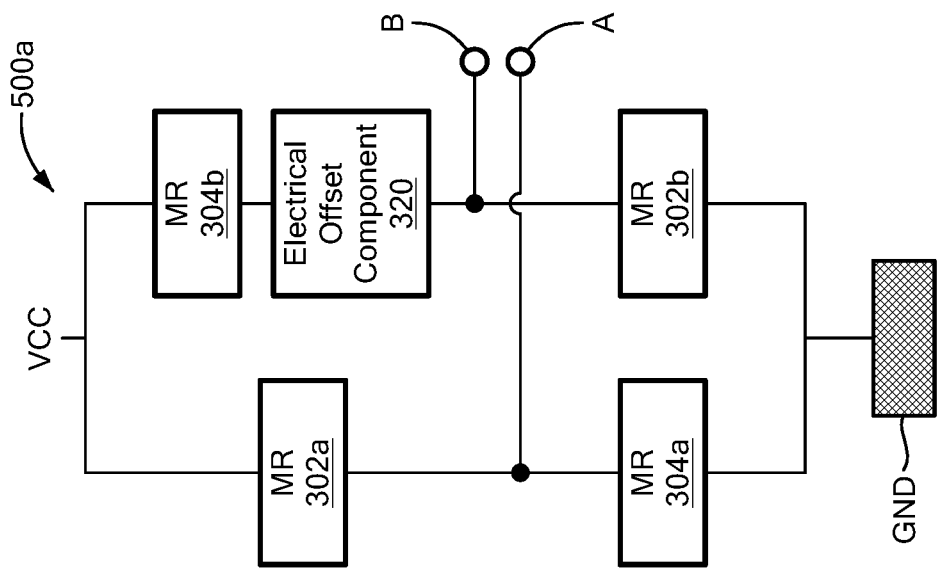
FIG. 5A is an example of an equivalent bridge circuit of the bridge circuitry in FIG. 3B when the first clock signal CLKA is at a high voltage level and the second clock signal CLKB is at a low voltage level.

Referring to FIGS. 5A and 5B, an example of an equivalent bridge circuit of the bridge circuitry 202' (FIG. 3B) in the first mode is a bridge circuit 500a. The output voltage of the bridge circuit 500a is:

$$Vout\_1st\ mode(b) = \frac{R2(B) - R1(B) - \Delta R/2}{R1(B) + R2(B)} \cdot VCC,$$

which is the same as bridge 300 (FIG. 3A), since closing switches 312, 314 and opening the switches 316 and 318 makes bridge circuit 500a equivalent to the bridge 300 (FIG. 3A).

An example of an equivalent bridge circuit of the bridge circuitry 202' (FIG. 3B) in the second mode is a bridge circuit 500b. The output voltage of the bridge 500b is:

$$Vout\_2nd\ mode(B) = \frac{R1(B) + \Delta R}{R1(B) + R2(B) + \Delta R} \cdot VCC - \frac{R1(B)}{R1(B) + R2(B)} \cdot VCC =$$

$$\frac{(R1(B) + \Delta R) \cdot (R1(B) + R2(B)) -}{(R1(B) + R2(B) + \Delta R) \cdot (R1(B) + R2(B))} \cdot VCC$$

For ΔR<<R1+R2, then Vout_2$^{nd}$ mode (B) equals $$= \frac{\left(R1(B) + \Delta R - R1(B) \cdot \left(1 + \frac{\Delta R}{R1(B) + R2(B)}\right)\right) \cdot (R1(B) + R2(B))}{(R1(B) + R2(B))^2} \cdot VCC =$$

$$\frac{\Delta R - \frac{R1(B) \cdot \Delta R}{R1(B) + R2(B)}}{R1(B) + R2(B)} \cdot VCC$$

Since $\frac{R1(B)}{R1(B) + R2(B)} \cong \frac{1}{2}$, for small B variations then $$Vout\_2nd\ mode(B) = \frac{\Delta R - \frac{\Delta R}{2}}{R1(B) + R2(B)} \cdot VCC$$

$$Vout\_2nd\ mode(B) = \frac{\frac{\Delta R}{2}}{R1(B) + R2(B)} \cdot VCC.$$

Thus, adding Vout_2nd mode(B) from Vout_1st mode(B) equals:

$$\frac{R2(B) - R1(B)}{R1(B) + R2(B)} \cdot VCC,$$

which does not include the electrical offset expression ΔR.

In one example, the rate the bridge circuitry 202' switches from the first mode to the second mode and back to the first mode (called a switching frequency) is more than the maximum signal frequency of the magnetic-field sensor 10 (FIG. 1). In another example, the switching frequency may be twice the maximum signal frequency of the magnetic-field sensor 10 (FIG. 1). In a further example, the switching frequency is greater than 1 kHz. In other examples, the switching frequency is faster than an electrical offset drift generated by a temperature drift.

Figure 6A:
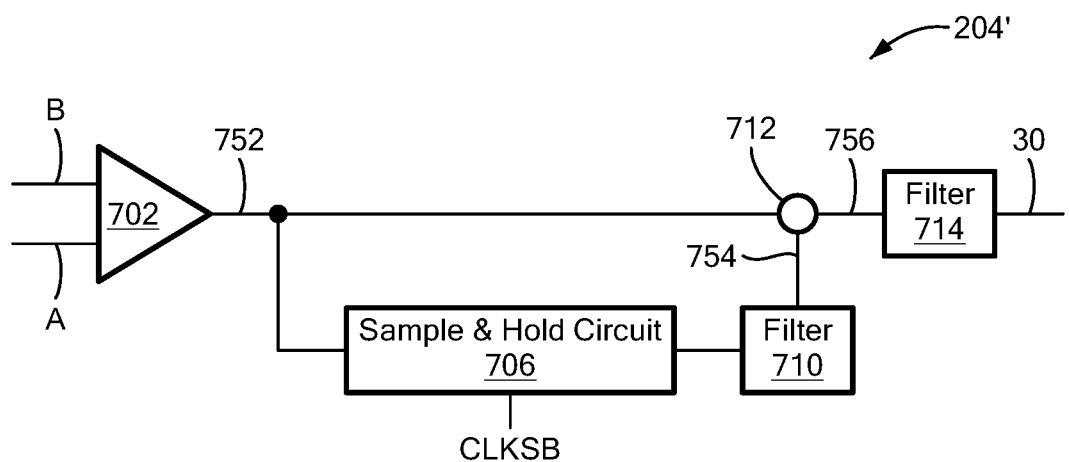
FIG. 6A is one example of offset processing circuitry.

Referring to FIG. 6A, an example of the offset processing circuitry 204 (FIG. 2) is an offset processing circuitry 204'. The offset processing circuitry 204' includes a differential amplifier 702, a sample & hold (S&H) circuit 706, a filter 710, an adder 712 and a filter 714.

The difference of the voltage signals A, B are received and amplified by the differential amplifier 702 to form a signal 752. The signal 752 is received by the S&H circuit 706. During the second mode, when the second clock signal CLKB is at a high voltage level, S&H circuit samples and holds the error offset component.

The S&H circuit 706 is controlled by a second clock sample signal CLKSB. In one example, when the second clock sample signal CLKSB is at a high voltage level, a sample of the signal 752 is taken and when the second clock sample signal CLKSB is at a logical low voltage level no sample of signal 752 is taken. The sample taken is the error component.

Figure 6B:
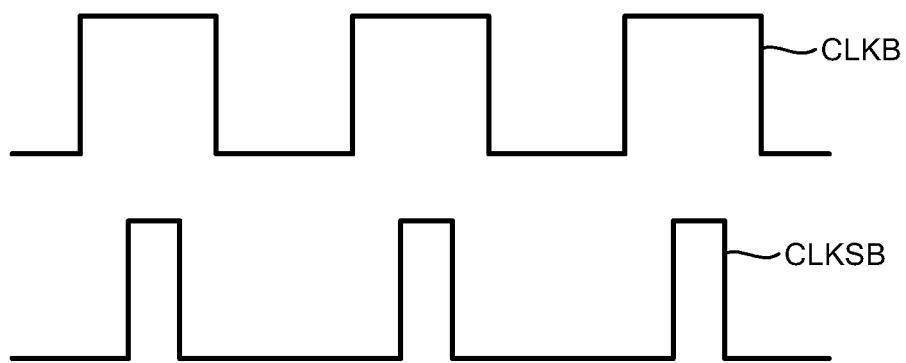
FIG. 6B is a graph of an example of a timing diagram of the second clock signal CLKB and a second clock sample signal CLKSB.

In one example, the second clock sample signal CLKSB may be the same as the second clock signal CLKB. In other examples, the second clock sample signal CLKSB may have a smaller duty cycle than the second clock signal CLKB, but the second clock sample signal CLKSB is only at a high voltage level when the second clock signal is at a high voltage level as depicted in FIG. 6B.

The filter 710 filters the error component. In one example, the filter 710 is a low pass filter. The adder 712 adds the error component from the signal 752 to produce a signal 756, which is filtered by the filter 714 to produce the signal 30. In one example, the filter 714 is a low-pass filter.

Figure 7A:
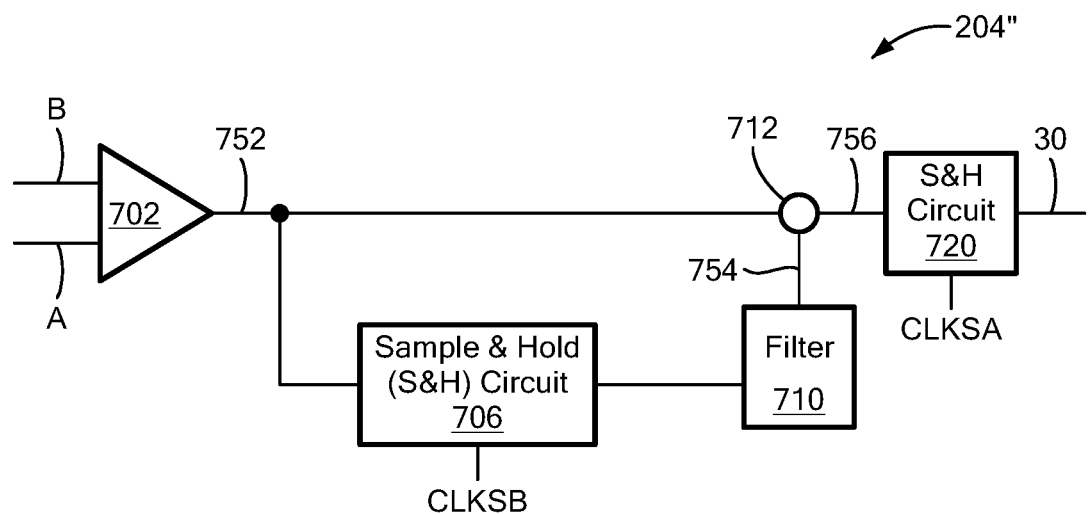
FIG. 7A is another example of the offset processing circuitry.

Referring to FIG. 7A, another example of the offset processing circuitry 204 (FIG. 2) is an offset processing circuitry 204". The offset processing circuitry 204" is the same as the offset circuitry 204' (FIG. 6A) except the filter 714 (FIG. 6A) is replaced by a S&H circuit 720. This may be desirable if the filter 714 (FIG. 6A) takes too long to settle.

The S&H circuit 720 is controlled by a first clock sample signal CLKSA. In one example, when the first clock sample signal CLKSA is at a high voltage level, a sample of the signal 756 is taken and when the first clock sample signal CLKSA is at a logical low voltage level no sample of signal 756 is taken. The sample taken is the output voltage of the MR bridge without the error component.

Figure 7B:
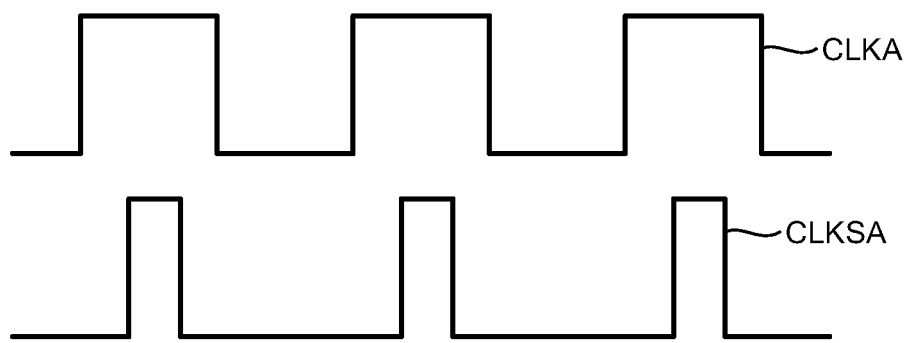
FIG. 7B is a graph of an example of a timing diagram of the first clock signal CLKA and a first clock sample signal CLKSB.

In one example, the first clock sample signal CLKSA may be the same as the first clock signal CLKA. In other examples, the first clock sample signal CLKSA may have a smaller duty cycle than the first clock signal CLKA, but the first clock sample signal CLKSA is only at a high voltage level when the first clock signal is at a high voltage level as depicted in FIG. 7B.

Having described preferred embodiments, which serve to illustrate various concepts, structures, and techniques, which are the subject of this patent, it will now become apparent to those of ordinary skill in the art that other embodiments incorporating these concepts, structures and techniques may be used.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. Bridge circuitry comprising:
   a first magnetoresistance (MR) element;
   a second MR element connected in series with the first MR element at a first node;
   a third MR element;
   a fourth MR element connected in series with the third MR element at a second node, wherein the first and second MR elements are in parallel with the third and fourth MR elements;
   a first switch connected at one end to a supply voltage and connected at the other end to the third MR element;
   a second switch connected at one end to ground and connected at the other end to the fourth MR element;
   a third switch connected at one end to ground and connected at the other end to the third MR element and the first switch; and
   a fourth switch connected at one end to the supply voltage and the other end to the fourth MR element and the second switch,
   wherein the bridge circuitry comprises no more than four switches.

2. The bridge circuitry of claim 1, wherein the first MR element and the fourth MR element are fabricated to have magnetic-field characteristics, which are substantially equal;
   wherein the second MR element and the third MR element are fabricated to have magnetic-field characteristics, which are substantially equal.

3. The bridge circuitry of claim 1, wherein the bridge circuitry is a magnetometer or a gradiometer.

4. The bridge circuitry of claim 1, wherein the bridge circuitry further comprises:
   a fifth switch connected at one end to the supply voltage and connected at the other end to the first MR element; and
   a sixth switch connected at one end to ground and connected at the other end to the second MR element,
   wherein the fifth switch and the sixth switch are each closed.

5. Bridge circuitry comprising:
   a first magnetoresistance (MR) element
   a second MR element connected in series with the first MR element at a first node;
   a third MR element;
   a fourth MR element connected in series with the third MR element at a second node, wherein the first and second MR elements are in parallel with the third and fourth MR elements;
   a first switch connected at one end to a supply voltage and connected at the other end to the third MR element;
   a second switch connected at one end to ground and connected at the other end to the fourth MR element;
   a third switch connected at one end to ground and connected at the other end to the third MR element and the first switch; and
   a fourth switch connected at one end to the supply voltage and the other end to the fourth MR element and the second switch,
   wherein in a first mode, the first and second switches are closed and the third and fourth switches are open,
   wherein in a second mode, the first and second switches are open and the third and fourth switches are closed, and
   wherein taking a summation of a differential voltage output of the bridge circuitry in the first mode with a differential voltage output of the bridge circuitry in the second mode removes an electrical offset component from a differential voltage output of the bridge circuitry.

6. The bridge circuitry of claim 5, wherein the first and second switches are controlled by a first clock signal,
wherein the third and fourth switches are controlled by a second clock signal.

7. The bridge circuitry of claim 6, wherein when the first clock signal is at a high voltage level, the second clock signal is at a low voltage level.

8. The bridge circuitry of claim 7, wherein when the first clock signal is at a low voltage level, the second clock signal is at a high voltage level.

9. Bridge circuitry comprising:
a first magnetoresistance (MR) element;
a second MR element connected in series with the first MR element at a first node;
a third MR element;
a fourth MR element connected in series with the third MR element at a second node, wherein the first and second MR elements are in parallel with the third and fourth MR elements;
a first switch connected at one end to a supply voltage and connected at the other end to the third MR element;
a second switch connected at one end to ground and connected at the other end to the fourth MR element;
a third switch connected at one end to ground and connected at the other end to the third MR element and the first switch; and
a fourth switch connected at one end to the supply voltage and the other end to the fourth MR element and the second switch,
wherein the first MR element and the fourth MR element are fabricated to have magnetic-field characteristics, which are substantially equal,
wherein the second MR element and the third MR element are fabricated to have magnetic-field characteristics, which are substantially equal, and
wherein the first MR element and the fourth MR element have magnetic-field reference angles which are substantially equal.

10. The bridge circuitry of claim 9, wherein the second MR element and the third MR element have magnetic-field reference angles which are substantially equal.

11. The bridge circuitry of claim 10, wherein the magnetic-field reference angles of the second and third MR elements are opposite to the magnetic-field reference angles of the first and fourth MR elements.

12. The bridge circuitry of claim 11, wherein the magnetic-field reference angles of the second and third MR elements are opposite to a direction of an external magnetic field.

13. The bridge circuitry of claim 10, wherein the magnetic-field reference angles of the second and third MR elements are substantially the same as the magnetic-field reference angles of the first and fourth MR elements.

14. The bridge circuitry of claim 13, wherein the first and fourth MR elements detect an external magnetic field that is an opposite direction from an external magnetic field detected by the second and third MR elements.

15. A magnetic-field sensor comprising bridge circuitry, the bridge circuitry comprising:
a first magnetoresistance (MR) element;
a second MR element connected in series with the first MR element at a first node;
a third MR element;
a fourth MR element connected in series with the third MR element at a second node, wherein the first and second MR elements are in parallel with the third and fourth MR elements;
a first switch connected at one end to a supply voltage and connected at the other end to the third MR element;
a second switch connected at one end to ground and connected at the other end to the fourth MR element;
a third switch connected at one end to ground and connected at the other end to the third MR element and the first switch; and
a fourth switch connected at one end to the supply voltage and the other end to the fourth MR element and the second switch,
wherein the bridge circuitry comprises no more than four switches.

16. The sensor of claim 15, wherein the first MR element and the fourth MR element are fabricated to have magnetic-field characteristics, which are substantially equal, and
wherein the second MR element and the third MR element are fabricated to have magnetic-field characteristics, which are substantially equal.

17. The sensor of claim 15, wherein the bridge circuitry is a magnetometer or a gradiometer.

18. The sensor of claim 15, wherein the bridge circuitry further comprises:
a fifth switch connected at one end to the supply voltage and connected at the other end to the first MR element; and
a sixth switch connected at one end to ground and connected at the other end to the second MR element,
wherein the fifth switch and the sixth switch are each closed.

19. The sensor of claim 15, further comprising offset processing circuitry configured to receive an output of the bridge circuitry.

20. A magnetic-field sensor comprising bridge circuitry, the bridge circuitry comprising:
a first magnetoresistance (MR) element;
a second MR element connected in series with the first MR element at a first node;
a third MR element;
a fourth MR element connected in series with the third MR element at a second node, wherein the first and second MR elements are in parallel with the third and fourth MR elements;
a first switch connected at one end to a supply voltage and connected at the other end to the third MR element;
a second switch connected at one end to ground and connected at the other end to the fourth MR element;
a third switch connected at one end to ground and connected at the other end to the third MR element and the first switch; and
a fourth switch connected at one end to the supply voltage and the other end to the fourth MR element and the second switch,
wherein in a first mode, the first and second switches are closed and the third and fourth switches are open,
wherein in a second mode, the first and second switches are open and the third and fourth switches are closed, and
wherein taking a summation of a differential voltage output of the bridge circuitry in the first mode with a differential voltage output of the bridge circuitry in the second mode removes an electrical offset component from a differential voltage output of the bridge circuitry.

21. The sensor of claim 20, wherein the first and second switches are controlled by a first clock signal,
wherein the third and fourth switches are controlled by a second clock signal.

22. The sensor of claim 21, wherein when the first clock signal is at a high voltage level, the second clock signal is at a low voltage level.

23. The sensor of claim 22, wherein when the first clock signal is at a low voltage level, the second clock signal is at a high voltage level.

24. A magnetic-field sensor comprising bridge circuitry, the bridge circuitry comprising:
a first magnetoresistance (MR) element;
a second MR element connected in series with the first MR element at a first node;
a third MR element;
a fourth MR element connected in series with the third MR element at a second node, wherein the first and second MR elements are in parallel with the third and fourth MR elements;
a first switch connected at one end to a supply voltage and connected at the other end to the third MR element;
a second switch connected at one end to ground and connected at the other end to the fourth MR element
a third switch connected at one end to ground and connected at the other end to the third MR element and the first switch; and
a fourth switch connected at one end to the supply voltage and the other end to the fourth MR element and the second switch,
wherein the first MR element and the fourth MR element are fabricated to have magnetic-field characteristics, which are substantially equal, and
wherein the second MR element and the third MR element are fabricated to have magnetic-field characteristics, which are substantially equal, and
wherein the first MR element and the fourth MR element have magnetic-field reference angles which are substantially equal.

25. The sensor of claim 24, wherein the second MR element and the third MR element have magnetic-field reference angles which are substantially equal.

26. The sensor of claim 25, wherein the magnetic-field reference angles of the second and third MR elements are opposite to the magnetic-field reference angles of the first and fourth MR elements.

27. The sensor of claim 26, wherein the magnetic-field reference angles of the second and third MR elements are opposite to a direction of an external magnetic field.

28. The sensor of claim 25, wherein the magnetic-field reference angles of the second and third MR elements are substantially the same as the magnetic-field reference angles of the first and fourth MR elements.

29. The sensor of claim 28, wherein the first and fourth MR elements detect an external magnetic field that is an opposite direction from an external magnetic field detected by the second and third MR elements.

30. A magnetic-field sensor comprising bridge circuitry, the bridge circuitry comprising:
a first magnetoresistance (MR) element a second MR element connected in series with the first MR element at a first node;
a third MR element;
a fourth MR element connected in series with the third MR element at a second node, wherein the first and second MR elements are in parallel with the third and fourth MR elements;
a first switch connected at one end to a supply voltage and connected at the other end to the third MR element;
a second switch connected at one end to ground and connected at the other end to the fourth MR element;
a third switch connected at one end to ground and connected at the other end to the third MR element and the first switch;
a fourth switch connected at one end to the supply voltage and the other end to the fourth MR element and the second switch; and
offset processing circuitry configured to receive an output of the bridge circuitry,
wherein the first and second switches are controlled by a first clock signal,
wherein the third and fourth switches are controlled by a second clock signal,
wherein the offset processing circuitry comprises:
an amplifier configured to receive the output of the bridge circuitry;
a sample and hold (S&H) configured to receive an output of the amplifier, wherein the S&H circuit is enabled by a third clock signal;
a filter configured to receive an output from the S&H circuit; and
an adder configured to receive the output of the amplifier and an output of the filter.

31. The sensor of claim 30, wherein the filter is a first filter, and
wherein the offset processing circuitry further comprises a second filter configured to receive an output of the adder.

32. The sensor of claim 30, wherein the third clock signal is equal to the second clock signal.

33. The sensor of claim 30, wherein the third clock signal has a smaller duty cycle than the second clock signal.

34. The sensor of claim 30, wherein the S&H circuit is a first S&H circuit, and
wherein the offset processing circuitry further comprises a second S&H configured to receive an output of the adder, wherein the second S&H circuit is enabled by a fourth clock signal.

35. The sensor of claim 34, wherein the fourth clock signal is equal to the first clock signal.

36. The sensor of claim 34, wherein the fourth clock signal has a smaller duty cycle than the first clock signal.

* * * * *

UNITED STATES PATENT AND TRADEMARK OFFICE
CERTIFICATE OF CORRECTION

PATENT NO. : 11,609,283 B2
APPLICATION NO. : 17/209471
DATED : March 21, 2023
INVENTOR(S) : Hernán D. Romero et al.

It is certified that error appears in the above-identified patent and that said Letters Patent is hereby corrected as shown below:

In the Specification

Column 2, Line 17 delete "directions" and replace with --angles--.

Column 3, Line 46 delete "S&H configured" and replace with --S&H circuit configured--.

Column 4, Line 34 delete "high low voltage" and replace with --high voltage--.

Column 4, Line 43 delete "CLKSB" and replace with --CLKSA--.

Column 4, Line 57 delete "magnetic is" and replace with --magnetic field is--.

Column 5, Line 18 delete "magnetoresistance detects" and replace with --magnetoresistance circuitry 16 detects--.

Column 7, Line 45 delete "202b" and replace with --302b--.

Column 14, Line 31 delete "(S&H) configured" and replace with --(S&H) circuit configured--.

Column 14, Line 50 delete "S&H configured" and replace with --S&H circuit configured--.

Signed and Sealed this
Sixth Day of August, 2024

Katherine Kelly Vidal
*Director of the United States Patent and Trademark Office*